(12) United States Patent  
Vinson (10) Patent No.: US 9,171,833 B2
(45) Date of Patent: Oct. 27, 2015

(54) SEMICONDUCTOR STRUCTURE FOR ENHANCED ESD PROTECTION

(71) Applicant: INTERSIL AMERICAS LLC, Milpitas, CA (US)

(72) Inventor: James Edwin Vinson, Palm Bay, FL (US)

(73) Assignee: Intersil Americas LLC, Milpitas, CA (US)

( * ) Notice: Subject to any disclaimer, the term of this patent is extended or adjusted under 35 U.S.C. 154(b) by 56 days.

(21) Appl. No.: 14/045,447

(22) Filed: Oct. 3, 2013

(65) Prior Publication Data

US 2015/0022921 A1    Jan. 22, 2015

Related U.S. Application Data

(60) Provisional application No. 61/847,170, filed on Jul. 17, 2013.

(51) Int. Cl.
| | | |
|---|---|---|
| H01L 29/66 | (2006.01) | |
| H01L 27/02 | (2006.01) | |
| H01L 29/74 | (2006.01) | |

(52) U.S. Cl.
CPC ........ H01L 27/0262 (2013.01); H01L 29/7436 (2013.01)

(58) Field of Classification Search
CPC .................................................. H01L 27/0262
USPC ........................................................ 257/335
See application file for complete search history.

(56) References Cited

U.S. PATENT DOCUMENTS

| | | | |
|---|---|---|---|
| 2004/0141269 A1* | 7/2004 | Kitagawa | 361/56 |
| 2008/0044955 A1* | 2/2008 | Salcedo et al. | 438/140 |
| 2008/0128756 A1* | 6/2008 | Satoh | 257/203 |

OTHER PUBLICATIONS

Intersil, "One Microamp Supply-Current, +3V to +5.5V, 250kbps, RS-232 Transmitters/Receivers", "Data Sheet", Mar. 1, 2006, pp. 1-28, Publisher: Intersil.
Intersil, "Single 16-Channel/Differential 8-Channel, High-Voltage,9.5 Ron, CMOS Analog Multiplexer", "FN3116.10", Jun. 26, 2009, pp. 1-21, Publisher: Intersil.

* cited by examiner

*Primary Examiner* — Ajay K Arora
(74) *Attorney, Agent, or Firm* — Fogg & Powers LLC (57) ABSTRACT

A semiconductor structure for enhanced ESD protection is disclosed. The semiconductor structure includes a plurality of fingers, wherein each finger of the plurality of fingers includes a plurality of voltage clamps, and each voltage clamp of the plurality of voltage clamps includes at least a first well having a first conductivity type and a second well having a second conductivity type, and a connection between a well tie of the first well of a first voltage clamp of the plurality of voltage clamps and a well tie of the first well of a second voltage clamp of the plurality of voltage clamps, wherein the connection is enabled to couple a bias voltage associated with a current flow in the first voltage clamp to the second voltage clamp, and the first voltage clamp and the second voltage clamp are thereby enabled to trigger on substantially simultaneously.

10 Claims, 6 Drawing Sheets

SEMICONDUCTOR STRUCTURE FOR ENHANCED ESD PROTECTION

CROSS-REFERENCE TO RELATED APPLICATIONS

This application is related to U.S. Provisional Patent Application Ser. No. 61/847,170 entitled "SEMICONDUCTOR STRUCTURE FOR ENHANCED ESD PROTECTION," filed on Jul. 17, 2013 and incorporated herein by reference. This application hereby claims to the benefit of U.S. Provisional Patent Application No. 61/847,170.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings.

DETAILED DESCRIPTION

In the following detailed description, reference is made to the accompanying drawings that form a part hereof, and in which are shown by way of specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be construed in a limiting sense.

Embodiments described herein provide semiconductor structures for enhanced Electrostatic Discharge (ESD) protection. For example, in one embodiment, the semiconductor structure can include a plurality of voltage clamps, which are utilized to provide enhanced ESD protection in a semiconductor integrated circuit (IC), wafer, chip or die. In some embodiments, the semiconductor structure is a multiple-finger ESD protection device, which includes, for example, a plurality of high voltage (e.g., >20V) ESD clamps with low holding voltages (e.g., <5V below the trigger voltage). Such higher voltage clamps with lower holding voltages can exhibit a deep snap-back behavior once they trigger into breakdown. The multiple voltage clamps are connected in parallel to achieve a much higher ESD current conduction capability than that of an individual clamp. In one exemplary embodiment, the semiconductor structure includes a plurality of Silicon-Controlled Rectifier (SCR) devices, which are utilized as NPN-triggered SCR voltage clamps. In a second exemplary embodiment, the semiconductor structure includes a plurality of PNP-triggered SCR devices also utilized as voltage clamps. In a third exemplary embodiment, the semiconductor structure includes a plurality of NPN Bipolar Junction Transistors (BJTs) or, alternatively in a fourth exemplary embodiment, PNP BJTs utilized as ESD voltage clamps. In any event, the semiconductor structure for enhanced ESD protection includes a plurality of ESD protection devices that can be formed, for example, as a plurality of voltage clamps in a Complementary Metal-Oxide Semiconductor (CMOS)/BJT/biCMOS or Double-diffused MOS (DMOS) IC fabrication process. The layout of the semiconductor structure for enhanced ESD protection is preferably linear, but in some embodiments, the layout of the semiconductor structure can be circular.

Essentially, embodiments of the present invention provide a semiconductor structure for enhanced ESD protection, which virtually simultaneously triggers a plurality of voltage clamps in the semiconductor structure if any blocking junction in the semiconductor structure begins to conduct current (i.e., a junction breaks down). For example, in one exemplary embodiment, the semiconductor structure is a multiple-finger, high voltage ESD protection device, and each voltage clamp in the semiconductor structure has a holding voltage that is lower than its trigger voltage (e.g., a high snap-back, multi-finger ESD protection device). The semiconductor structure detects when a finger begins to conduct current (i.e., junction breakdown point), and utilizes that current to drive the remaining fingers on. Consequently, the semiconductor structure provides uniform triggering (and uniform current distribution) in a multiple finger ESD protection device, such as, for example, a high snap-back, multi-finger ESD protection device in a semiconductor IC, wafer, chip or die. As such, the semiconductor structure for enhanced ESD protection provides a much higher ESD protection capability than conventional ESD protection devices. Furthermore, in some embodiments, the semiconductor structure for enhanced ESD protection is configured to tie (electrically) all of the trigger wells together. Consequently, the trigger current is increased proportionately by the number of individual SCR (or BJT) clamps that are connected in parallel. As a result, the semiconductor structure for enhanced ESD protection is more rugged with respect to Electrical Over-Stress (EOS) events and also transient effects such as, for example, transients caused by single event radiation. For clarity, an ESD event is the sudden discharge of static electricity from an electrically-charged object to a semiconductor device, such as an integrated circuit, chip, wafer or die.

Figure 1:
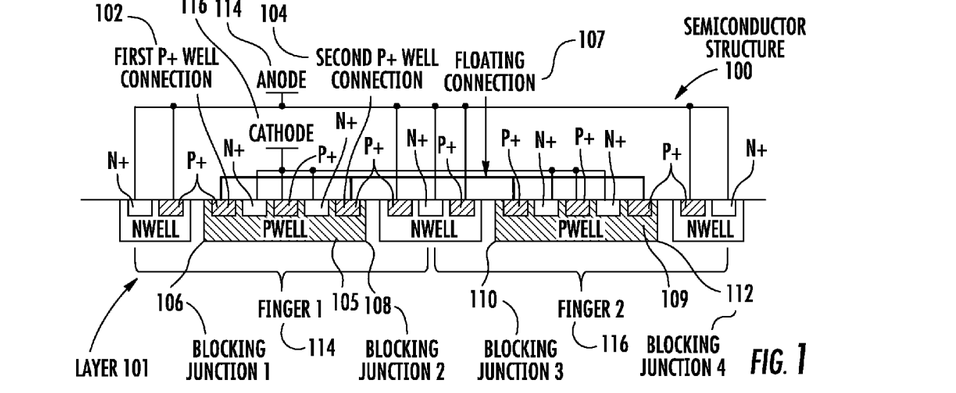
FIG. 1 depicts a side elevation, cross-sectional view of a semiconductor structure for enhanced ESD protection, in accordance with one exemplary embodiment of the present invention.

FIG. 1 depicts a side elevation, cross-sectional view of a semiconductor structure 100 for enhanced ESD protection, in accordance with one exemplary embodiment of the present invention. For example, in some embodiments, semiconductor structure 100 can be a multiple finger ESD protection device that includes a plurality of SCR devices (e.g., configured as voltage clamps) with N-type or P-type background doping. More precisely, semiconductor structure 100 can be formed as a linear structure (or, in some embodiments as a circular structure) with a P-type layer (i.e., having a P-type conductivity) in a lightly doped, deep N-well region (i.e., having an N-type conductivity) that isolates the semiconductor structure 100 from a P-type semiconductor substrate (i.e., N-type background doping). Alternatively, for example, semiconductor structure 100 can be formed with an N-type layer in a lightly doped, deep P-well region that isolates the semiconductor structure 100 from an N-type semiconductor substrate (i.e., P-type background doping). In other embodiments, semiconductor structure 100 can be a multiple finger, BJT ESD protection device that includes a plurality of NPN or PNP transistors (e.g., configured as voltage clamps) with N-type or P-type background doping. In some exemplary embodiments, semiconductor structure 100 can be a unidirectional ESD protection device (e.g., having one anode pin and one cathode pin). In other exemplary embodiments, semiconductor structure 100 can be a bidirectional ESD protection device (e.g., two semiconductor structures connected in series). For example, an anode of a first semiconductor structure 100 can be connected to an input port or pin of an integrated circuit to be protected from an ESD event (e.g., static discharge on that port or pin). The cathode of that first semiconductor structure is connected to the cathode of a second semiconductor structure, and the anode of the second semiconductor structure is connected to circuit ground. Alternatively, in another exemplary embodiment of a bidirectional ESD protection device, the cathode of a first semiconductor structure 100 is connected to the input port or pin of an integrated circuit to be protected, and the anode of that first semiconductor structure is connected to the anode of a second semiconductor structure (100). The cathode of the second semiconductor structure is connected to circuit ground.

Referring to the exemplary embodiment shown in FIG. 1, semiconductor structure 100 includes a first well connection 102 (e.g., well tie) with a P+ type conductivity, and a second well connection 104 (e.g., well tie) with a P+ type conductivity, formed in a well 105 with a P-type conductivity (e.g., PWELL). Well 105 is formed in a surface of a region or layer of semiconductor material 101 having an N-type conductivity. For example, the well 105 can be formed by implanting dopants into layer 101 utilizing a suitable implantation process. The first and second well connections 102, 104 are low resistance connections and are formed closest to the first blocking junction 106 and second blocking junction 108, respectively, of the PWELL 105. For clarity, a "blocking junction" or "blocking region" is the P/N or N/P junction in an SCR or BJT ESD protection device (e.g., described in more detail below with respect to FIGS. 2 through 6) that blocks the flow of current through the junction until the voltage across the junction reaches a predetermined, threshold level. When the voltage across the blocking junction reaches this threshold level (i.e., "junction breakdown"), the device triggers on and current begins to flow through the junction and in the device. One or more blocking junctions can be formed by a well referred to herein as a "blocking well."

Embodiments of the present invention include at least two blocking junctions or blocking regions. For example, as described in more detail below, a first blocking region 106 in FIG. 1 is formed between a portion of a first semiconductor region doped to a first conductivity type, e.g., well 105 doped to a P-type conductivity, and a second semiconductor region doped to a second conductivity type, e.g., layer 101 doped to an N-type conductivity. A second blocking region, e.g., blocking region 108, 110 or 112 is formed between a different portion of a semiconductor region of the first conductivity type, e.g., well 105 or well 109, and a second semiconductor region doped to the second conductivity type, e.g., layer 101. Other embodiments of this structure are shown and described below with respect to FIGS. 2-6.

Returning to FIG. 1, the first well connection 102 and the second well connection 104 are tied to identical well connections in a second PWELL 109. As such, the blocking wells 105 and 109 are electrically tied together by a floating connection 107. For example, the floating connection 107 can be formed utilizing a suitable metallization process. All of the well connections in the three NWELLs shown in FIG. 1 are tied together and electrically connected to an anode pad 114 of the semiconductor structure 100. Also, all of the well connections in the PWELLs 105, 109, which are not connected to the floating connection 107, are tied together and electrically connected to a cathode pad 116. As such, the anode pad 114 is tied to all of the anodes of the plurality of devices (e.g., SCRs or BJTs) utilized for ESD protection in a semiconductor structure such as, for example, semiconductor structure 100, and the cathode pad 116 is tied to all of the cathodes of the plurality of devices (e.g., SCRs or BJTs) in that semiconductor structure. Consequently, if any blocking junction 106, 108, 110 or 112 starts to conduct (i.e., a junction breaks down) in one blocking well, the bias voltage generated across that junction is coupled to the other blocking well(s) via the floating connection 107. The metal connecting these "floating" junctions is significantly lower in resistance (e.g., ohms) than the resistance of the PWELL region (e.g., Kilo-ohms). Consequently, the bias voltage detected at any blocking well where breakdown is occurring (e.g., due to an occurrence of an ESD event) is applied virtually simultaneously to all of the blocking wells in the semiconductor structure 100. Therefore, all of the parasitic NPN transistors in the SCRs involved (or in other embodiments, the BJTs involved) are uniformly turned on, and the multiple fingers 114, 116 are enabled to operate effectively to conduct current virtually simultaneously at breakdown and thus provide enhanced ESD protection over conventional ESD protection devices (e.g., wherein only one blocking junction is triggered).

In operation, assume (for example) that an ESD event (e.g., electrostatic discharge) has occurred at the port or pin of an integrated circuit, the anode pad 114 of semiconductor structure 100 is connected to that port or pin, and the cathode pad 116 of semiconductor structure 100 is connected to a ground connection of the integrated circuit involved. Also assume, for example, that due to the non-uniform structural and/or electrical characteristics of the blocking junctions 106, 108, 110, 112, blocking junction 106 breaks down first (triggers) and current begins to flow through that junction. In other words, the voltage resulting from the ESD event is applied to the anode pad 114, that voltage surpasses the breakdown voltage of the blocking junction(s) involved, and one of the blocking junctions (e.g., 106) begins to conduct current. In this example, that current flows from the junction 106 through the center P+ well connection of PWELL 105, and then through the cathode pad 116 to circuit ground. The bias voltage thus developed at the first P+ well connection 102 is electrically coupled to the second P+ well connection 104 and the identical well connections in PWELL 109 by the floating connection 107. Consequently, the bias voltage coupled from the first P+ well connection 102 to the other P+ well connections in PWELL 105 and PWELL 109 causes current to flow through the PWELL to cathode connections, which is effectively the same as each blocking junction 108, 110, 112 "breaking down" almost simultaneously with blocking junction 106. Specifically, the current flows from the blocking junction involved through the center P+ well connections of PWELL 105 and PWELL 109, and then through the cathode pad 116 to circuit ground. In other words, all of the fingers (e.g., 114, 116) in semiconductor structure 100 are turned on virtually simultaneously to protect the integrated circuit when an ESD event occurs.

Figure 2:
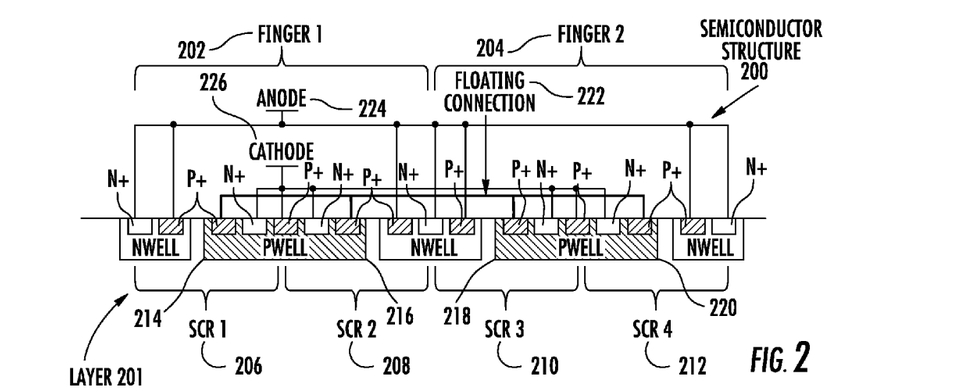
FIG. 2 depicts a side elevation, cross-sectional view of a semiconductor structure for enhanced ESD protection, in accordance with a second exemplary embodiment of the present invention.

FIG. 2 depicts a side elevation, cross-sectional view of a semiconductor structure 200 for enhanced ESD protection, in accordance with a second exemplary embodiment of the present invention. In the illustrative embodiment shown, semiconductor structure 200 is a two-finger ESD protection device with four SCRs (e.g., configured as voltage clamps) and N-type conductivity background doping. The layout of semiconductor structure 200 can be linear or circular.

Referring to the exemplary embodiment shown in FIG. 2, semiconductor structure 200 includes a first finger 202 and a second finger 204. The first finger 202 includes a first SCR device 206 and a second SCR device 208. The second finger 204 includes a third SCR device 210 and a fourth SCR device 212. As such, each finger includes a left and right SCR device. The four SCR devices are configured as voltage clamps. For example, the active areas of the four SCR devices can be defined and formed utilizing suitable implantation and diffusion processes. In this embodiment, there are four trigger junctions 214, 216, 218, 220 shown (hereinafter, the terms "trigger junctions", "blocking junctions" and "blocking regions" may be used interchangeably). In operation, any one of the trigger junctions 214, 216, 218 or 220 can break down first. In the configuration shown, the background doping concentration of the semiconductor layer 201 is considered to be N-type. Consequently, in this configuration, the electric field builds up on the PWELL junction, and the trigger element is the parasitic NPN transistor of each of the SCRs 206, 208, 210, 212 formed between the NWELL, PWELL, N+ components. As such, if any one of the trigger junctions 214, 216, 218 or 220 begins to conduct current (i.e., junction breakdown point), the floating connection 222 couples the bias voltage from the P+ well tie closest to that junction to the remaining trigger junctions, which biases all of the trigger junctions to the same voltage potential. All of the well connections in the three NWELLs shown in FIG. 2 are tied together and electrically connected to an anode pad 224 of the semiconductor structure 200. Also, all of the well connections in the two PWELLs, which are not connected to the floating connection 222, are tied together and electrically connected to a cathode pad 226. As such, the anode pad 224 is tied to all of the anodes of the plurality of devices (e.g., SCRs) utilized for ESD protection in a semiconductor structure such as, for example, semiconductor structure 200, and the cathode pad 226 is tied to all of the cathodes of the plurality of devices (e.g., SCRs) in that semiconductor structure. Therefore, all of the parasitic NPN transistors in the SCRs 206, 208, 210, 212 are uniformly turned on, and the first and second fingers 202, 204 are enabled to operate effectively to conduct current virtually simultaneously at breakdown and thus provide enhanced ESD protection over conventional ESD protection devices that utilize SCRs.

Figure 3:
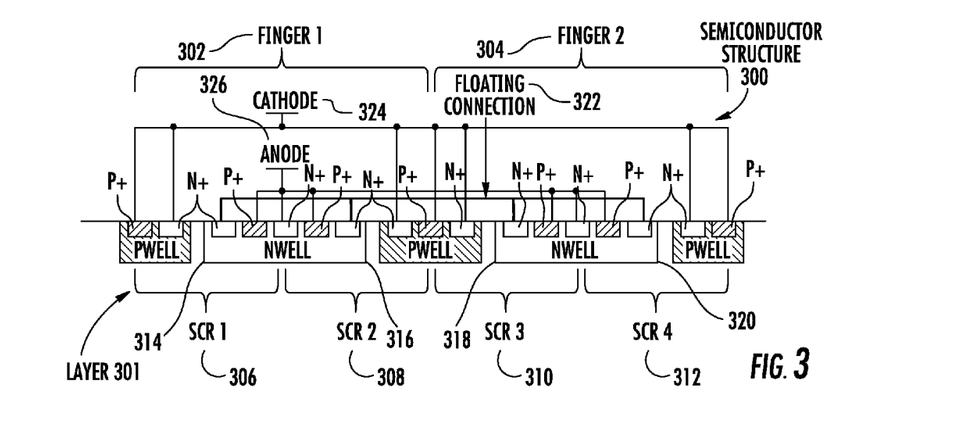
FIG. 3 depicts a side elevation, cross-sectional view of a semiconductor structure for enhanced ESD protection, in accordance with a third exemplary embodiment of the present invention.

FIG. 3 depicts a side elevation, cross-sectional view of a semiconductor structure 300 for enhanced ESD protection, in accordance with a third exemplary embodiment of the present invention. In the illustrative embodiment shown, semiconductor structure 300 is a two-finger ESD protection device with four SCRs (e.g., configured as voltage clamps) and P-type conductivity background doping. The layout of semiconductor structure 300 can be linear or circular.

Referring to the exemplary embodiment shown in FIG. 3, semiconductor structure 300 includes a first finger 302 and a second finger 304. The first finger 302 includes a first SCR device 306 and a second SCR device 308. The second finger 304 includes a third SCR device 310 and a fourth SCR device 312. As such, each finger includes a left and right SCR device. The four SCR devices are configured as voltage clamps. For example, the active areas of the four SCR devices can be defined and formed utilizing suitable implantation and diffusion processes. In this embodiment, there are four trigger (blocking) junctions 314, 316, 318, 320 shown. In operation, any one of the trigger junctions 314, 316, 318 or 320 can break down first. In the configuration shown, the background doping concentration of semiconductor layer 301 is considered to be P-type. Consequently, in this configuration, the electric field builds up on the NWELL junction, and the trigger element is the parasitic PNP transistor of each of the SCRs 306, 308, 310, 312 formed between the PWELL, NWELL, and P+ components. As such, if any one of the trigger junctions 314, 316, 318 or 320 begins to conduct current (i.e., junction breakdown point), the floating connection 322 couples the bias voltage from the N+ well tie closest to that junction to the remaining trigger junctions, which biases all of the trigger junctions to the same voltage potential. All of the well connections in the three PWELLs shown in FIG. 3 are tied together and electrically connected to a cathode pad 324 of the semiconductor structure 300. Also, all of the well connections in the two NWELLs, which are not connected to the floating connection 322, are tied together and electrically connected to an anode pad 326. As such, the cathode pad 324 is tied to all of the cathodes of the plurality of devices (e.g., SCRs) utilized for ESD protection in a semiconductor structure such as, for example, semiconductor structure 300, and the anode pad 326 is tied to all of the anodes of the plurality of devices (e.g., SCRs) in that semiconductor structure. Therefore, all of the parasitic NPN transistors in the SCRs 306, 308, 310, 312 are uniformly turned on, and the first and second fingers 302, 304 are enabled to operate effectively to conduct current virtually simultaneously at breakdown and thus provide enhanced ESD protection over conventional ESD protection devices that utilize SCRs.

Figure 4:
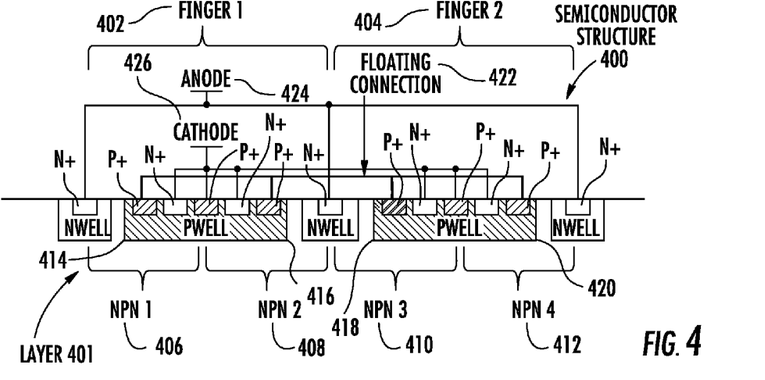
FIG. 4 depicts a side elevation, cross-sectional view of a semiconductor structure for enhanced ESD protection, in accordance with a fourth exemplary embodiment of the present invention.

FIG. 4 depicts a side elevation, cross-sectional view of a semiconductor structure 400 for enhanced ESD protection, in accordance with a fourth exemplary embodiment of the present invention. In the illustrative embodiment shown, semiconductor structure 400 is a two-finger, BJT ESD protection device with four NPN transistors (e.g., configured as voltage clamps) and N-type conductivity background doping. The layout of semiconductor structure 400 can be linear or circular.

Referring to the exemplary embodiment shown in FIG. 4, semiconductor structure 400 includes a first finger 402 and a second finger 404. The first finger 402 includes a first NPN transistor device 406 and a second NPN transistor device 408. The second finger 404 includes a third NPN transistor device 410 and a fourth NPN transistor device 412. As such, each finger includes a left and right NPN transistor device. The four NPN transistor devices are configured as voltage clamps. For example, the active areas of the four NPN transistor devices can be defined and formed utilizing suitable implantation and diffusion processes. In this embodiment, there are four trigger (blocking) junctions 414, 416, 418, 420 shown. In operation, any one of the trigger junctions 414, 416, 418 or 420 can break down first. In the configuration shown, the background doping concentration of semiconductor layer 401 is considered to be N-type. Consequently, the electric field builds up on the PWELL junction, and the trigger elements are the NPN transistors 406, 408, 410, 412 in the regions between the NWELL and PWELL components. As such, if any one of the trigger junctions 414, 416, 418 or 420 begins to conduct current (i.e., junction breakdown point), the floating connection 422 couples the bias voltage from the P+ well tie closest to that junction to the remaining trigger junctions, which biases all of the trigger junctions to the same voltage potential. All of the well connections in the three NWELLs shown in FIG. 4 are tied together and electrically connected to an anode pad 424 of the semiconductor structure 400. Also, all of the well connections in the two PWELLs, which are not connected to the floating connection 422, are tied together and electrically connected to a cathode pad 426. As such, the anode pad 424 is tied to all of the anodes of the plurality of devices (e.g., BJTs) utilized for ESD protection in a semiconductor structure such as, for example, semiconductor structure 400, and the cathode pad 426 is tied to all of the cathodes of the plurality of devices (e.g., BJTs) in that semiconductor structure. Therefore, all of the NPN transistors 406, 408, 410, 412 are uniformly turned on, and the first and second fingers 402, 404 are enabled to operate effectively to conduct current virtually simultaneously at breakdown and thus provide enhanced ESD protection over conventional ESD protection devices that utilize BJTs.

Figure 5:
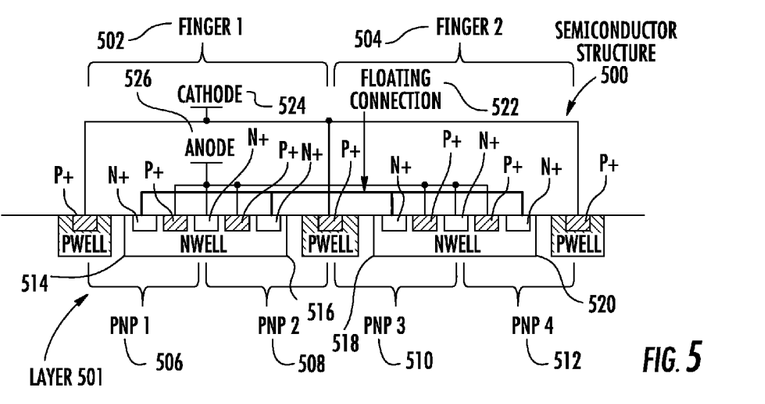
FIG. 5 depicts a side elevation, cross-sectional view of a semiconductor structure for enhanced ESD protection, in accordance with a fifth exemplary embodiment of the present invention.

FIG. 5 depicts a side elevation, cross-sectional view of a semiconductor structure 500 for enhanced ESD protection, in accordance with a fifth exemplary embodiment of the present invention. In the illustrative embodiment shown, semiconductor structure 500 is a two-finger, BJT ESD protection device with four PNP transistors (e.g., configured as voltage clamps) and P-type conductivity background doping. The layout of semiconductor structure 500 can be linear or circular.

Referring to the exemplary embodiment shown in FIG. 5, semiconductor structure 500 includes a first finger 502 and a second finger 504. The first finger 502 includes a first PNP transistor device 506 and a second PNP transistor device 508. The second finger 504 includes a third PNP transistor device 510 and a fourth PNP transistor device 512. As such, each finger includes a left and right PNP transistor device. The four PNP transistor devices are configured as voltage clamps. For example, the active areas of the four PNP transistor devices can be defined and formed utilizing suitable implantation and diffusion processes. In this embodiment, there are four trigger (blocking) junctions 514, 516, 518, 520 shown. In operation, any one of the trigger junctions 514, 516, 518 or 520 can break down first. In the configuration shown, the background doping concentration of semiconductor layer 501 is considered to be P-type. Consequently, the electric field builds up on the NWELL junction, and the trigger elements are the PNP transistors 506, 508, 510, 512 in the regions between the NWELL and PWELL components. As such, if any one of the trigger junctions 514, 516, 518 or 520 begins to conduct current (i.e., junction breakdown point), the floating connection 522 couples the bias voltage from the N+ well tie closest to that junction to the remaining trigger junctions, which biases all of the trigger junctions to the same voltage potential. All of the well connections in the three PWELLs shown in FIG. 5 are tied together and electrically connected to a cathode pad 524 of the semiconductor structure 500. Also, all of the well connections in the two NWELLs, which are not connected to the floating connection 522, are tied together and electrically connected to an anode pad 526. As such, the cathode pad 524 is tied to all of the cathodes of the plurality of devices (e.g., BJTs) utilized for ESD protection in a semiconductor structure such as, for example, semiconductor structure 500, and the anode pad 526 is tied to all of the anodes of the plurality of devices (e.g., BJTs) in that semiconductor structure. Therefore, all of the PNP transistors 506, 508, 510, 512 are uniformly turned on, and the first and second fingers 502, 504 are enabled to operate effectively to conduct current virtually simultaneously at breakdown and thus provide enhanced ESD protection over conventional ESD protection devices that utilize BJTs.

Figure 6:
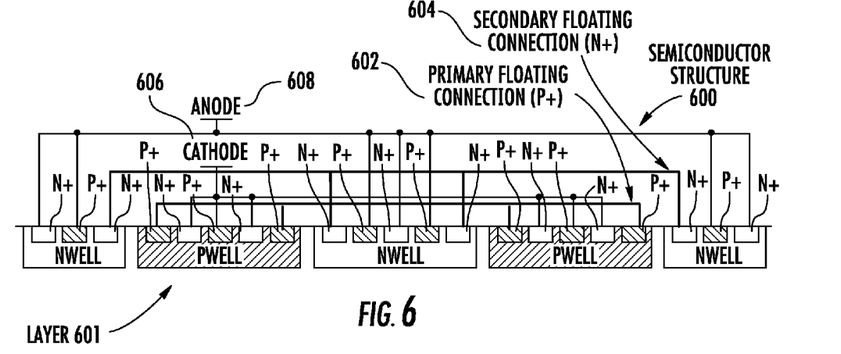
FIG. 6 depicts a side elevation, cross-sectional view of a semiconductor structure for enhanced ESD protection, in accordance with a sixth exemplary embodiment of the present invention.

FIG. 6 depicts a side elevation, cross-sectional view of a semiconductor structure 600 for enhanced ESD protection, in accordance with a sixth exemplary embodiment of the present invention. In the illustrative embodiment shown, semiconductor structure 600 is a multiple finger, ESD protection device with a plurality of SCRs (e.g., configured as voltage clamps) and N-type conductivity background doping. Notably, in other embodiments, semiconductor structure 600 can also be implemented with a plurality of SCRs and P-type conductivity background doping. The layout of semiconductor structure 600 can be linear or circular.

Referring to the exemplary embodiment shown in FIG. 6, semiconductor structure 600 includes a first (e.g., primary) floating connection 602 and a second (e.g., secondary) floating connection 604. The first floating connection 602 is configured to interconnect a plurality of P+ well ties of the primary transistor (e.g., NPN transistor) shown, and the second floating connection 604 is configured to interconnect a plurality of N+ well ties of the secondary transistor (e.g., PNP transistor) shown. In the configuration shown, the background doping concentration of semiconductor layer 601 is considered to be N-type. In operation, when an ESD event (e.g., static discharge) occurs, the anode pad 608 is biased high. As a result, a blocking junction of a PWELL is turned on, which forces current into that PWELL. The primary floating connection (e.g., bus) 602 causes all of the (primary) NPN transistors to turn on, which in turn, causes current to be injected into the NWELL involved (collector of NPN transistor). The secondary floating connection 604 (e.g., bus) couples this bias to all of the NWELL connections, which enables all of the (secondary) PNP transistors to turn on uniformly. Consequently, the semiconductor structure 600 including a primary and secondary floating connection produces a smoother and more uniform snap-back response for the SCRs involved.

Figure 7:
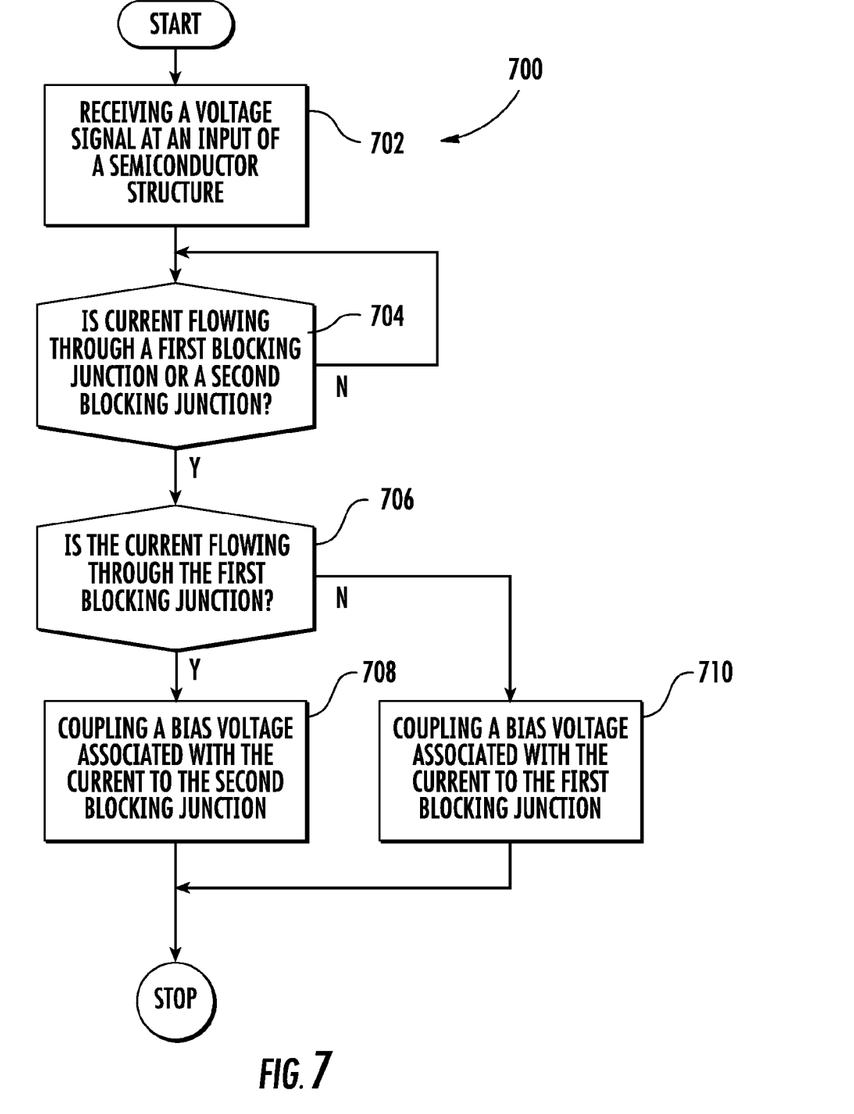
FIG. 7 depicts a flow diagram of a method of operation of a semiconductor structure for enhanced ESD protection, in accordance with one or more embodiments of the present invention.

FIG. 7 depicts a flow diagram 700 of a method of operation of a semiconductor structure for enhanced ESD protection, in accordance with one or more embodiments of the present invention. For example, the illustrative embodiment shown in FIG. 7 can represent a method of operation for any one of the semiconductor structures 100-600 shown in FIGS. 1-6. As such, referring to FIG. 7 (and also FIG. 1 for one exemplary embodiment), method 700 begins, at block 702, with the semiconductor structure (e.g., 100) receiving (e.g., via anode pad 114) a voltage signal associated with an ESD event (e.g., electrostatic discharge) from an input pin or port of an integrated circuit. Next, at block 704, responsive to the received voltage signal, if current begins to flow through a first blocking junction (e.g., 106) or a second blocking junction (e.g., 108) in the semiconductor structure, this current flow indicates that breakdown is occurring (e.g., due to the ESD event) at the blocking junction involved. Next, at block 706, if the current is flowing through the first blocking junction (e.g., 106), then at block 708, the bias voltage developed across that blocking junction (e.g., 106) is coupled (e.g., via the floating connection 107) to the second blocking junction (e.g., 108). This bias voltage triggers the second blocking junction, which also begins to conduct current. However, if at block 706, the current is flowing through the second blocking junction (e.g., 108), then at block 710, the bias voltage developed across that blocking junction (e.g., 108) is coupled to the first blocking junction. In other words, for example, as illustrated by exemplary method 700, if current begins flowing through any one of the blocking junctions (e.g., 106, 108, 110, 112), then the bias voltage developed across that blocking junction is coupled virtually simultaneously to all of the other blocking junctions in the semiconductor structure involved.

Figure 8A:
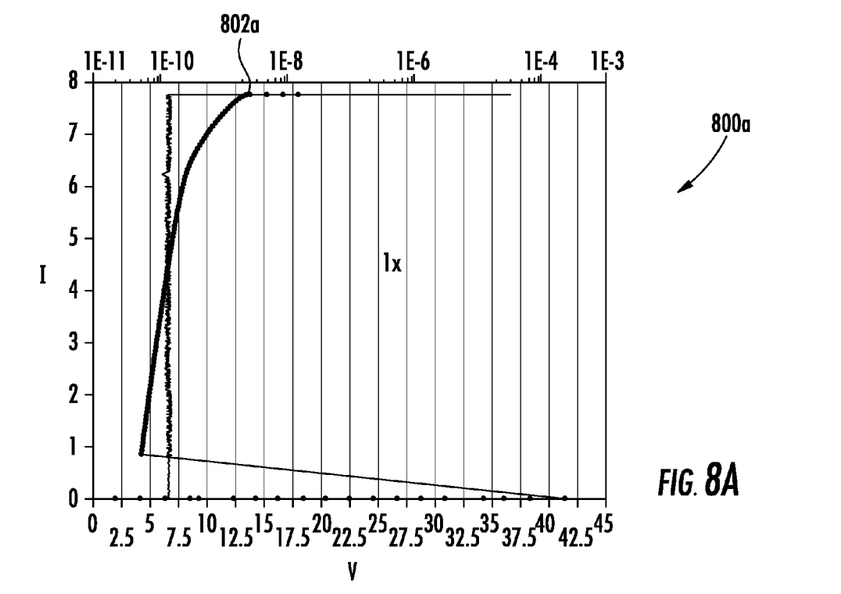
FIGS. 8A-8B depict related diagrams of Transmission Line Pulse (TLP) measurement curves for a single strip and double strip circular ESD protection device including one or more semiconductor structures configured in accordance with one embodiment of the present invention.
Figure 8B:
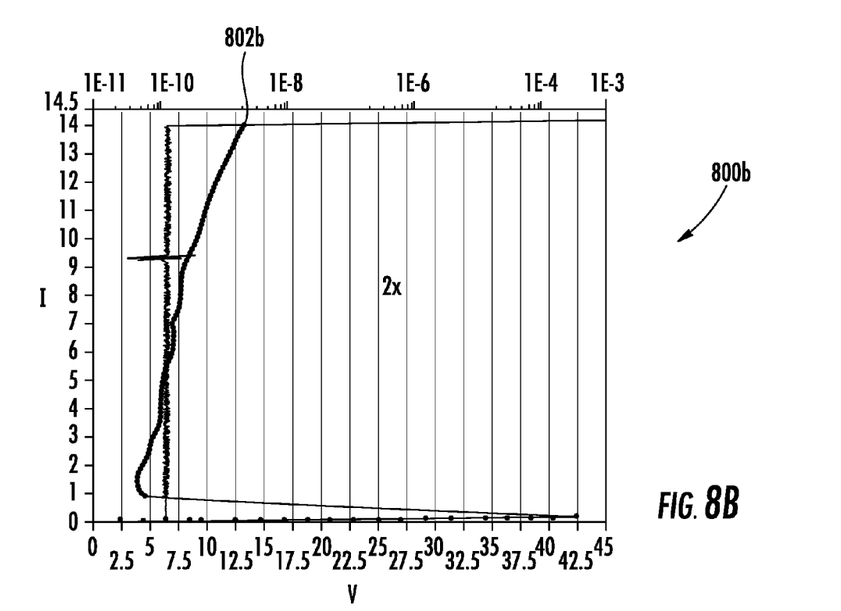

FIGS. 8A-8B depict related diagrams 800a-800b of Transmission Line Pulse (TLP) current-voltage (I-V) measurement curves for a single strip and double strip circular ESD protection device including one or more semiconductor structures configured in accordance with one embodiment of the present invention. For the exemplary semiconductor structure (s) involved, the diagram 800a in FIG. 8A indicates at point 802a that the failure current of the measured, single strip ESD protection device is approximately 7.8 A. The diagram 800b in FIG. 8B indicates at point 802b that the failure current of the measured, double strip ESD protection device is approximately 14.2 A. The trigger voltages utilized are between 41V and 42.5V. As indicated by the failure currents of the single strip and double strip circular ESD protection device measurements depicted in FIGS. 8A and 8B, both of the strips in the double strip ESD protection device are conducting current. Consequently, these TLP measurements indicate that the multiple fingers (strips) of the double strip ESD protection devices are being uniformly triggered on.

Figure 9A:
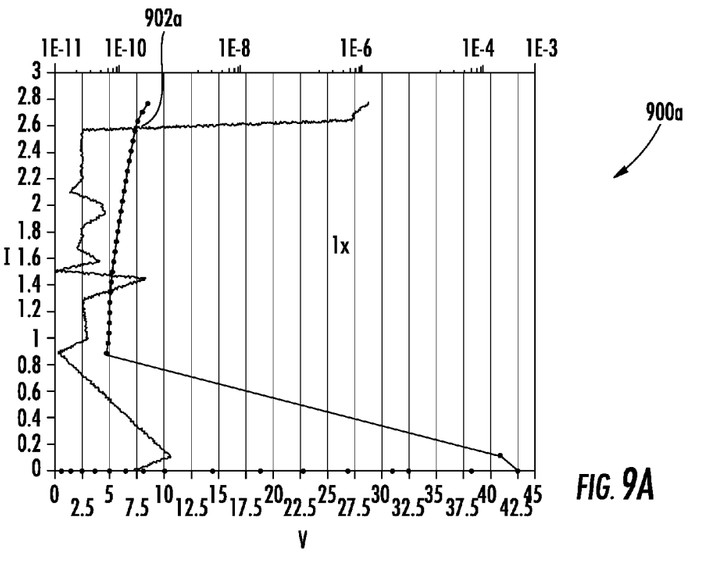
FIGS. 9A-9C depict related diagrams of TLP measurement curves for a single strip, double strip, and four-strip circular ESD protection device including one or more semiconductor structures configured in accordance with one embodiment of the present invention.
Figure 9B:
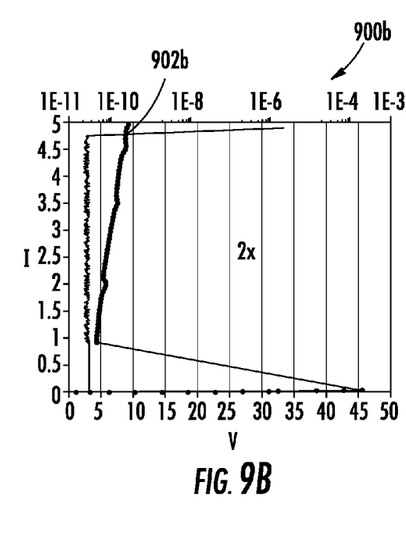
Figure 9C:
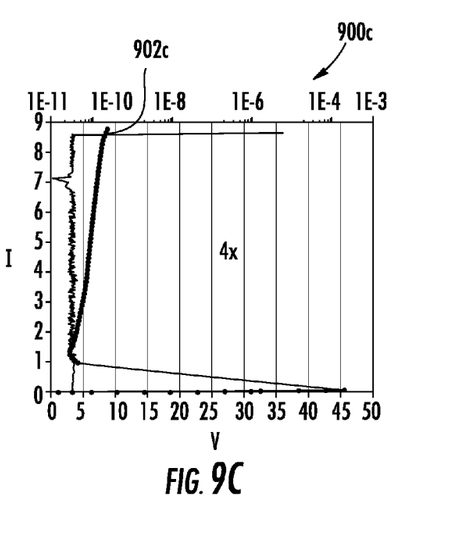

FIGS. 9A-9C depict related diagrams 900a-900c of TLP I-V measurement curves for a single strip, double strip, and four-strip circular ESD protection device including one or more semiconductor structures configured in accordance with one embodiment of the present invention. For the exemplary semiconductor structure(s) involved, the diagram 900a in FIG. 9A indicates at point 902a that the failure current of the measured, single strip ESD protection device is approximately 2.59 A. The diagram 900b in FIG. 9B indicates at point 902b that the failure current of the measured, double strip ESD protection device is approximately 4.75 A. The diagram 900c in FIG. 9C indicates at point 902c that the failure (leakage) current of the measured, four-strip ESD protection device is approximately 8.75 A. As indicated by the failure currents of the double strip and four-strip circular ESD protection device measurements depicted in FIGS. 9B and 9C, all of the strips are conducting current. Consequently, these TLP measurements indicate that the multiple fingers (strips) of the ESD protection devices are being uniformly triggered on.

Figure 10:
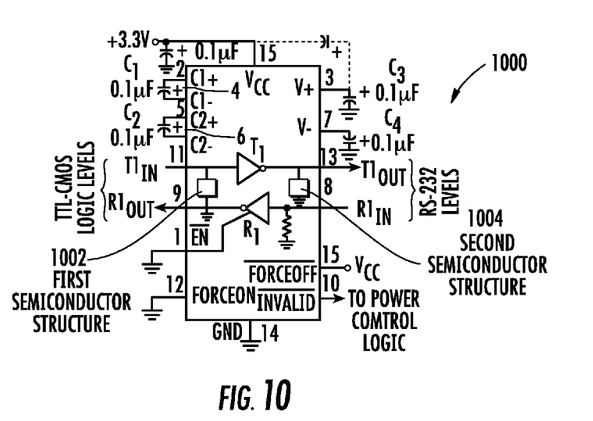
FIG. 10 depicts a schematic, block diagram of an exemplary transmitter/receiver system that can be utilized to implement a semiconductor structure for enhanced ESD protection, in accordance with one or more embodiments of the present invention.

FIG. 10 depicts a schematic, block diagram of an exemplary transmitter/receiver system 1000 that can be utilized to implement a semiconductor structure for enhanced ESD protection, in accordance with one or more embodiments of the present invention. In some embodiments, transmitter/receiver system 1000 can be implemented as a semiconductor IC or chip. Referring to FIG. 10 for one exemplary embodiment, transmitter/receiver system 1000 includes a transmitter T1 and a receiver R1. In other embodiments, transmitter/receiver system 1000 can include a plurality of transmitters and receivers in a semiconductor IC or chip. In any event, the anode pad (e.g., 114) of a first semiconductor structure 1002 for enhanced ESD protection is connected to the input connection $T1_{IN}$ of the transmitter T1, and the cathode pad (e.g., 116) of the first semiconductor structure is connected to circuit ground. Also, the anode pad of a second semiconductor structure 1004 for enhanced ESD protection is connected to the output connection $T1_{OUT}$ of the transmitter T1, and the cathode pad of the second semiconductor structure is connected to circuit ground. Furthermore, a plurality of other semiconductor structures for enhanced ESD protection can be connected to other circuit components of the transmitter/receiver system 1000 between their respective pin connections and ground. If an ESD event occurs on the input connection $T1_{IN}$ or the output connection $T1_{OUT}$, for example, all of the clamps in the pertinent semiconductor structure are simultaneously triggered and uniformly turned on.

Figure 11:
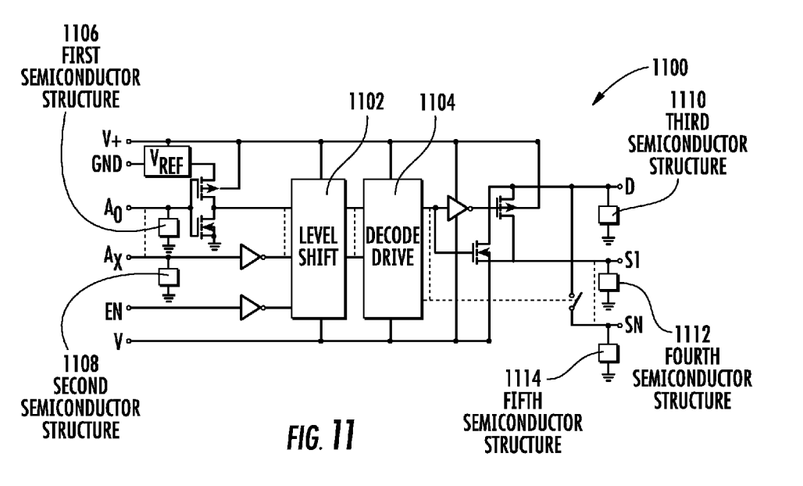
FIG. 11 depicts a schematic, block diagram of an exemplary analog switch configured as a multiplexer/demultiplexer (e.g., MUX switch) system that can be utilized to implement a semiconductor structure for enhanced ESD protection, in accordance with one or more embodiments of the present invention.

FIG. 11 depicts a schematic, block diagram of an exemplary analog switch configured as a multiplexer/demultiplexer (e.g., MUX switch) system 1100 that can be utilized to implement a semiconductor structure for enhanced ESD protection, in accordance with one or more embodiments of the present invention. In some embodiments, MUX switch system 1100 can be implemented on a semiconductor IC or chip. Referring to FIG. 11 for one exemplary embodiment, MUX switch system 1100 includes (among other components) a level shift unit 1102 and a decoder/driver unit 1104. In the exemplary embodiment shown, the anode pad (e.g., 114) of a first semiconductor structure 1106 for enhanced ESD protection is connected to the input connection $A_0$, and the cathode pad (e.g., 116) of the first semiconductor structure is connected to circuit ground. Also, the anode pad of a second semiconductor structure 1108 for enhanced ESD protection is connected to the input connection $A_X$, and the cathode pad of the semiconductor structure is connected to circuit ground. Additional semiconductor structures for enhanced ESD protection can be connected between each of the other input connections $A_1$ to $A_{X-1}$ and circuit ground. A third semiconductor structure 1110 for enhanced ESD protection is connected between the main output connection D and circuit ground, a fourth semiconductor structure 1112 for enhanced ESD protection is connected between the main multiplexor connection $S_1$ and circuit ground, and a fifth semiconductor structure 1114 for enhanced ESD protection is connected between the main multiplexor connection $S_N$ and circuit ground. Additional semiconductor structures for enhanced ESD protection can be connected between the other main multiplexor connections $S_2$ to $S_{N-1}$ and circuit ground. Also, a plurality of other semiconductor structures for enhanced ESD protection can be connected to other circuit components of the MUX switch system 1100 between their respective pin connections and ground. If an ESD event occurs on any one of the inputs or outputs shown, all of the clamps in the pertinent semiconductor structure are simultaneously triggered and uniformly turned on.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

EXAMPLE EMBODIMENTS

Example 1 includes a semiconductor structure, comprising: a first blocking junction between a first well having a first conductivity type and a layer of semiconductor material having a second conductivity type; at least a second blocking junction between a second well having the first conductivity type and the layer of semiconductor material; and a floating connection coupled to the first blocking junction and the at least a second blocking junction, wherein the floating connection is enabled to couple a bias voltage associated with a current flow through the first blocking junction to the at least a second blocking junction, and the first blocking junction and the at least a second blocking junction are thereby enabled to trigger and conduct current substantially simultaneously.

Example 2 includes the semiconductor structure of Example 1, further comprising: a third blocking junction between the first well and the layer of semiconductor material; a fourth blocking junction in the second well and the layer of semiconductor material; and the floating connection coupled to the third blocking junction and the fourth blocking junction, wherein the third blocking junction and the fourth blocking junction are thereby enabled to trigger and conduct current substantially simultaneously with the first blocking junction and the at least a second blocking junction.

Example 3 includes the semiconductor structure of Example 2, further comprising: a first well connection having the first conductivity type connected between the at least a first blocking junction and the floating connection; and a second well connection having the first conductivity type connected between the third blocking junction and the floating connection.

Example 4 includes the semiconductor structure of any of Examples 1-3, further comprising: a plurality of fingers, wherein the first well is disposed in a first finger of the plurality of fingers, and the second well is disposed in a second finger of the plurality of fingers.

Example 5 includes the semiconductor structure of any of Examples 1-4, wherein the first blocking junction comprises a junction in a first Silicon-Controlled Rectifier (SCR) device, and the at least a second blocking junction comprises a junction in a second SCR device.

Example 6 includes the semiconductor structure of any of Examples 1-5, wherein the first blocking junction comprises a junction in a first Bipolar Junction Transistor (BJT) device, and the at least a second blocking junction comprises a junction in a second BJT device.

Example 7 includes the semiconductor structure of any of Examples 1-6, wherein the semiconductor structure comprises a plurality of NPN-triggered or PNP-triggered SCR voltage clamps.

Example 8 includes the semiconductor structure of any of Examples 1-7, wherein the semiconductor structure comprises a plurality of NPN or PNP BJT voltage clamps.

Example 9 includes the semiconductor structure of any of Examples 1-8, further comprising: a third well having a second conductivity type; and a fourth well having the second conductivity type, wherein the third well and the fourth well are coupled to an anode connection of the semiconductor structure, and a well connection of the first well and a well connection of the second well are coupled to a cathode connection of the semiconductor structure.

Example 10 includes a semiconductor structure, comprising: a first blocking region formed between a portion of a first semiconductor region having a first conductivity type and a second semiconductor region having a second conductivity type, wherein the first semiconductor region is formed in a surface of the second semiconductor region; a second blocking region formed between a portion of a third semiconductor region having the first conductivity type and the second semiconductor region having the second conductivity type; and a floating connection coupled to the first semiconductor region and the third semiconductor region.

Example 11 includes the semiconductor structure of Example 10, wherein the first semiconductor region is a first blocking well, the third semiconductor region is a second blocking well, and the floating connection is electrically coupled to a well tie of the first blocking well and a well tie of the second blocking well.

Example 12 includes the semiconductor structure of any of Examples 10-11, wherein the floating connection enables the first blocking region and the second blocking region to trigger and conduct current substantially simultaneously.

Example 13 includes the semiconductor structure of Example 12, wherein the first blocking region is a first blocking junction of an SCR or a BJT, the second blocking region is a second blocking junction of the SCR or the BJT, and the first blocking junction and the second blocking junction are triggered by an occurrence of an electrostatic discharge (ESD) event.

Example 14 includes a semiconductor structure, comprising: a plurality of fingers, wherein each finger of the plurality of fingers includes a plurality of voltage clamps, and each voltage clamp of the plurality of voltage clamps includes at least a first well having a first conductivity type and a second well having a second conductivity type; and a connection between a well tie of the first well of a first voltage clamp of the plurality of voltage clamps and a well tie of the first well of a second voltage clamp of the plurality of voltage clamps, wherein the connection is enabled to couple a bias voltage associated with a current flow in the first voltage clamp to the second voltage clamp, and the first voltage clamp and the second voltage clamp are thereby enabled to trigger on substantially simultaneously.

Example 15 includes the semiconductor structure of Example 14, further comprising a second connection between a well tie of the second well of the first voltage clamp of the plurality of voltage clamps and a well tie of the second well of the second voltage clamp of the plurality of voltage clamps.

Example 16 includes the semiconductor structure of any of Examples 14-15, wherein the plurality of voltage clamps comprises a plurality of NPN-triggered or PNP-triggered SCR devices.

Example 17 includes the semiconductor structure of any of Examples 14-16, wherein the plurality of voltage clamps comprises a plurality of NPN or PNP BJTs.

Example 18 includes the semiconductor structure of any of Examples 14-17, wherein the semiconductor structure comprises at least one multiple-finger, high snap-back ESD protection device.

Example 19 includes a method of operation of a semiconductor structure, comprising: receiving a voltage signal associated with an ESD event; responsive to the voltage signal, enabling a current flow through a first blocking junction or at least a second blocking junction of the semiconductor structure; if the current is flowing through the first blocking junction, coupling a first bias voltage associated with the current to the at least a second blocking junction and thereby triggering the first blocking junction and the at least a second blocking junction substantially simultaneously; and if the current is flowing through the at least a second blocking junction, coupling a second bias voltage associated with the current to the first blocking junction and thereby triggering the first blocking junction and the at least a second blocking junction substantially simultaneously.

Example 20 includes the method according to Example 19, wherein the receiving comprises receiving the voltage signal from an input pin or an output pin of an integrated circuit.

Example 21 includes the method according to any of Examples 19-20, wherein the coupling comprises: triggering a plurality of SCR or BJT voltage clamps substantially simultaneously and responsive to an occurrence of the ESD event.

Example 22 includes a method of operation of a semiconductor structure, comprising: receiving a voltage signal associated with an ESD event at an anode connection of the semiconductor structure; coupling the voltage signal to a first well region having a first conductivity type disposed in a deep well region having the first conductivity type; responsive to the voltage signal, turning on a parasitic transistor disposed partly in the first well region having the first conductivity type and partly in a second well region having a second conductivity type and also disposed in the deep well region; responsive to the turning on the parasitic transistor, coupling the voltage signal to a first junction between the second well region and the deep well region; if a current begins to flow through the first junction, coupling the current to a cathode connection of the semiconductor structure and thereby generating a bias voltage across the first junction; coupling the bias voltage from the first well region to a third well region having the second conductivity type; and triggering a second junction in the third well region to conduct current substantially simultaneously with the first junction.

Example 23 includes the method of Example 22, wherein the wherein the receiving comprises receiving the voltage signal from an input pin or an output pin of an integrated circuit.

Example 24 includes the method of any of Examples 22-23, wherein the coupling comprises: triggering a plurality of SCR or BJT voltage clamps substantially simultaneously and responsive to an occurrence of the ESD event.

Example 25 includes a method of manufacture of a semiconductor structure, comprising: forming a first well region having a first conductivity type in a deep well region having a second conductivity type; forming a first well connection having the first conductivity type and a second well connection having the first conductivity type in a surface portion of the first well region; forming a second well region having the first conductivity type in the deep well region having the second conductivity type; forming a third well connection having the first conductivity type and a fourth well connection having the first conductivity type in a surface portion of the second well region; forming a floating connection over the first well region and the second well region; and coupling the floating connection to the first well connection, the second well connection, the third well connection, and the fourth well connection, wherein the floating connection is thereby enabled to couple a voltage from the first well connection to the second well connection, the third well connection, and the fourth well connection substantially simultaneously in response to an occurrence of an ESD event.

Example 26 includes the method of manufacture of Example 25, wherein the first well region is a first blocking well in a first SCR device, and the second well region is a second blocking well in a second SCR device.

Example 27 includes the method of manufacture of any of Examples 25-26, wherein the first well region is a first blocking well in a first BJT device, and the second well region is a second blocking well in a second BJT device.

Example 28 includes the method of manufacture of any of Examples 25-27, wherein the forming the first well region in the deep well region comprises forming at least a first blocking junction between the first well region and the deep well region, and the forming the second well region in the deep well region comprises forming at least a second blocking junction between the second well region and the deep well region.

Example 29 includes the method of manufacture of any of Examples 25-28, wherein the first well region is disposed in a first finger of the semiconductor structure, and the second well region is disposed in a second finger of the semiconductor structure.

Example 30 includes a system, comprising: a transmitter unit; a receiver unit; and a plurality of semiconductor structures, wherein a first semiconductor structure of the plurality of semiconductor structures is connected to an input or an output of the transmitter unit and circuit ground, the first semiconductor structure comprising: a plurality of fingers, wherein each finger of the plurality of fingers includes a plurality of voltage clamps, and each voltage clamp of the plurality of voltage clamps includes at least a first well having a first conductivity type and a second well having a second conductivity type; and a connection between a well tie of the first well of a first voltage clamp of the plurality of voltage clamps and a well tie of the first well of a second voltage clamp of the plurality of voltage clamps, wherein the connection is enabled to couple a bias voltage associated with a current flow in the first voltage clamp to the second voltage clamp, and the first voltage clamp and the second voltage clamp are thereby enabled to trigger on substantially simultaneously.

Example 31 includes the system of Example 30, wherein the system comprises a transceiver formed on a semiconductor wafer, chip, IC or die.

Example 32 includes a system, comprising: a level shift unit; a decode/drive unit; and a plurality of semiconductor structures, wherein a first semiconductor structure of the plurality of semiconductor structures is connected to an input of the level shift unit and circuit ground, the first semiconductor structure comprising: a plurality of fingers, wherein each finger of the plurality of fingers includes a plurality of voltage clamps, and each voltage clamp of the plurality of voltage clamps includes at least a first well having a first conductivity type and a second well having a second conductivity type; and a connection between a well tie of the first well of a first voltage clamp of the plurality of voltage clamps and a well tie of the first well of a second voltage clamp of the plurality of voltage clamps, wherein the connection is enabled to couple a bias voltage associated with a current flow in the first voltage clamp to the second voltage clamp, and the first voltage clamp and the second voltage clamp are thereby enabled to trigger on substantially simultaneously.

Example 33 includes the system of Example 32, wherein the system comprises an analog switch configured as a multiplexer/demultiplexer (MUX) switch formed on a semiconductor wafer, chip, IC or die.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present invention be limited only by the claims and the equivalents thereof.

What is claimed is:

1. A method of ESD protection, comprising:
a semiconductor structure receiving a voltage signal associated with an ESD event;
responsive to the voltage signal, enabling a current flow through a first blocking junction or at least a second blocking junction of the semiconductor structure;
if the current is flowing through the first blocking junction, coupling a first bias voltage associated with the current to the at least a second blocking junction and thereby triggering the first blocking junction and the at least a second blocking junction substantially simultaneously; and
if the current is flowing through the at least a second blocking junction, coupling a second bias voltage associated with the current to the first blocking junction and thereby triggering the first blocking junction and the at least a second blocking junction substantially simultaneously.

2. The method according to claim 1, wherein the receiving comprises receiving the voltage signal from an input pin or an output pin of an integrated circuit.

3. The method according to claim 1, wherein the coupling comprises:
triggering a plurality of SCR or BJT voltage clamps substantially simultaneously and responsive to an occurrence of the ESD event.

4. A method of ESD protection, comprising:
a semiconductor structure receiving a voltage signal associated with an ESD event at an anode connection of the semiconductor structure;
coupling the voltage signal to a first well region having a first conductivity type disposed in a deep well region having the first conductivity type;
responsive to the voltage signal, turning on a parasitic transistor disposed partly in the first well region having the first conductivity type and partly in a second well region having a second conductivity type and also disposed in the deep well region;
responsive to the turning on the parasitic transistor, coupling the voltage signal to a first junction between the second well region and the deep well region;
if a current begins to flow through the first junction, coupling the current to a cathode connection of the semiconductor structure and thereby generating a bias voltage across the first junction;
coupling the bias voltage from the first well region to a third well region having the second conductivity type; and
triggering a second junction in the third well region to conduct current substantially simultaneously with the first junction.

5. The method of claim 4, wherein the wherein the receiving comprises receiving the voltage signal from an input pin or an output pin of an integrated circuit.

6. The method of claim 4, wherein the coupling comprises:
triggering a plurality of SCR or BJT voltage clamps substantially simultaneously and responsive to an occurrence of the ESD event.

7. A method of manufacture of a semiconductor structure, comprising:
forming a first well region having a first conductivity type in a deep well region having a second conductivity type;
forming a first well connection having the first conductivity type and a second well connection having the first conductivity type in a surface portion of the first well region;
forming a second well region having the first conductivity type in the deep well region having the second conductivity type;
forming a third well connection having the first conductivity type and a fourth well connection having the first conductivity type in a surface portion of the second well region;
forming a floating connection over the first well region and the second well region; and
coupling the floating connection to the first well connection, the second well connection, the third well connection, and the fourth well connection, wherein the floating connection is thereby enabled to couple a voltage from the first well connection to the second well connection, the third well connection, and the fourth well connection substantially simultaneously in response to an occurrence of an ESD event, wherein the forming the first well region in the deep well region comprises forming at least a first blocking junction between the first well region and the deep well region, and the forming the second well region in the deep well region comprises forming at least a second blocking junction between the second well region and the deep well region.

8. The method of manufacture of claim 7, wherein the first well region is a first blocking well in a first SCR device, and the second well region is a second blocking well in a second SCR device.

9. The method of manufacture of claim 7, wherein the first well region is a first blocking well in a first BJT device, and the second well region is a second blocking well in a second BJT device.

10. The method of manufacture of claim 7, wherein the semiconductor structure comprises a plurality of fingers, each finger includes one or more voltage clamps, the first well region is disposed in a first finger of the semiconductor structure, and the second well region is disposed in a second finger of the semiconductor structure.

* * * * *